US012808944B2

(12) United States Patent
Lee

(10) Patent No.: US 12,808,944 B2
(45) Date of Patent: Nov. 24, 2026

(54) BATTERY MANAGEMENT APPARATUS AND METHOD

(71) Applicant: LG ENERGY SOLUTION, LTD., Seoul (KR)

(72) Inventor: Ho Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 614 days.

(21) Appl. No.: 18/268,114

(22) PCT Filed: Jan. 7, 2022

(86) PCT No.: PCT/KR2022/000329
§ 371 (c)(1),
(2) Date: Jun. 16, 2023

(87) PCT Pub. No.: WO2022/149917
PCT Pub. Date: Jul. 14, 2022

(65) Prior Publication Data

US 2024/0003980 A1 Jan. 4, 2024

(30) Foreign Application Priority Data

Jan. 8, 2021 (KR) ........................ 10-2021-0002908

(51) Int. Cl.
*G01R 31/396* (2019.01)
*G01R 31/36* (2020.01)
(Continued)

(52) U.S. Cl.
CPC ......... *G01R 31/396* (2019.01); *G01R 31/367* (2019.01); *G01R 31/3842* (2019.01); *G01R 31/392* (2019.01); *G01R 31/3648* (2013.01)

(58) Field of Classification Search
CPC ............... G01R 31/396; G01R 31/367; G01R 31/3842; G01R 31/392; G01R 31/3648
See application file for complete search history.

(56) References Cited

U.S. PATENT DOCUMENTS

2009/0009178 A1 1/2009 Okamoto et al.
2010/0004885 A1 1/2010 Nakanishi
(Continued)

FOREIGN PATENT DOCUMENTS

AU 2019238615 A1 11/2020
CN 110709717 A 1/2020
(Continued)

OTHER PUBLICATIONS

Extended European Search Report for European Application No. 22736894.1, dated May 24, 2024.
(Continued)

*Primary Examiner* — John C Kuan
(74) *Attorney, Agent, or Firm* — Birch, Stewart, Kolasch & Birch, LLP

(57) ABSTRACT

A battery management apparatus can include a measuring unit configured to measure a voltage and a current of a battery cell, a calculating unit configured to determine an operating period of the battery cell based on the current of the battery cell, and calculate a comparison value for the battery cell by normalizing the voltage of the battery cell, and a diagnosing unit configured to diagnose a state of the battery cell by comparing a comparison value of the battery cell with a reference value.

18 Claims, 12 Drawing Sheets

(51) Int. Cl.

| | |
|---|---|
| ***G01R 31/367*** | (2019.01) |
| ***G01R 31/3842*** | (2019.01) |
| ***G01R 31/392*** | (2019.01) |

(56) References Cited

U.S. PATENT DOCUMENTS

| | | | | |
|---|---|---|---|---|
| 2016/0103188 | A1* | 4/2016 | Eifert | G01R 31/392 324/435 |
| 2017/0126027 | A1* | 5/2017 | Park | B60L 3/0046 |
| 2017/0269167 | A1 | 9/2017 | Wiley | |
| 2018/0203070 | A1 | 7/2018 | Park | |
| 2019/0346513 | A1 | 11/2019 | Markochev | |
| 2020/0081066 | A1 | 3/2020 | Ahn | |
| 2020/0191876 | A1 | 6/2020 | Shin et al. | |
| 2020/0319259 | A1* | 10/2020 | Pressman | G05B 23/0235 |
| 2021/0005939 | A1 | 1/2021 | Tajma et al. | |
| 2021/0048482 | A1 | 2/2021 | Ukumori | |
| 2021/0234386 | A1* | 7/2021 | Purkayastha | H01M 10/425 |
| 2021/0257681 | A1 | 8/2021 | Takahashi et al. | |
| 2021/0382114 | A1* | 12/2021 | Oyama | G01R 31/388 |
| 2022/0196754 | A1 | 6/2022 | Kim et al. | |
| 2023/0132746 | A1 | 5/2023 | Tajima et al. | |

FOREIGN PATENT DOCUMENTS

| | | | |
|---|---|---|---|
| JP | 2004-247319 | A | 9/2004 |
| JP | 2008-288192 | A | 11/2008 |
| JP | 2009-85676 | A | 4/2009 |
| JP | 4647293 | B2 | 3/2011 |
| JP | 5080153 | B2 | 11/2012 |
| JP | 6033210 | B2 | 11/2016 |
| JP | 2017-67627 | A | 4/2017 |
| JP | 6236775 | B2 | 11/2017 |
| JP | 2019-537923 | A | 12/2019 |
| JP | 2020-520461 | A | 7/2020 |
| KR | 10-1991-0003390 | A | 2/1991 |
| KR | 10-2017-0060732 | A | 6/2017 |
| KR | 10-2018-0085165 | A | 7/2018 |
| KR | 10-2019-0095754 | A | 8/2019 |
| KR | 10-2020-0119383 | A | 10/2020 |
| WO | WO 2019/116145 | A1 | 6/2019 |
| WO | WO 2019/181727 | A1 | 8/2019 |
| WO | WO 2019/234390 | A1 | 12/2019 |
| WO | WO 2019/243950 | A1 | 12/2019 |
| WO | WO 2020/262789 | A1 | 12/2020 |

OTHER PUBLICATIONS

Schmid et al., "Data-Driven Fault Diagnosis in Battery Systems Through Cross-Cell Monitoring," IEEE Sensors Council, vol. 21, No. 2, Aug. 19, 2020, pp. 1829-1837.

International Search Report for PCT/KR2022/000329 (PCT/ISA/210) mailed on Apr. 19, 2022.

* cited by examiner

BATTERY MANAGEMENT APPARATUS AND METHOD

TECHNICAL FIELD

Cross-Reference to Related Application

This application claims priority to and the benefit of Korean Patent Application No. 10-2021-0002908 filed in the Korean Intellectual Property Office on Jan. 8, 2021, the entire contents of which are incorporated herein by reference.

TECHNICAL FIELD

Embodiments disclosed herein relate to a battery management apparatus and method.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium-ion batteries. Among the secondary batteries, a lithium-ion battery has a much higher energy density than those of the conventional Ni/Cd batteries, Ni/MH batteries, etc. Moreover, the lithium-ion battery may be manufactured to be small and lightweight, such that the lithium-ion battery has been used as a power source of mobile devices. In addition, the lithium-ion battery is attracting attention as a next-generation energy storage medium as a usage range thereof is expanded to a power source of electric vehicles.

Furthermore, the secondary battery is generally used as a battery pack including a battery module where a plurality of battery cells are connected to one another in series and/or in parallel. The battery pack may be managed and controlled by a battery management system in terms of a state and an operation.

For such a lithium-ion battery, an unstable behavior appears depending on a charging/discharging state of the battery cell. The unstable behavior occurring during charging/discharging of the battery cell may lead to accidents such as fire unless it is diagnosed early. However, conventionally, there is no clear criterion for classifying such abnormality. As such, it is an important task to diagnose the abnormal behavior of the battery cell and classify a type of each abnormal behavior.

DISCLOSURE

Technical Problem

Embodiments disclosed herein aim to provide a battery management apparatus and method in which by early diagnosing an unstable behavior of the battery cell and classifying a type of the unstable behavior, a failure of a battery cell may be early predicted to prevent an accident.

Technical problems of the embodiments disclosed herein are not limited to the above-described technical problems, and other unmentioned technical problems would be clearly understood by one of ordinary skill in the art from the following description.

Technical Solution

A battery management apparatus according to an embodiment disclosed herein includes a measuring unit configured to measure a voltage and a current of a battery cell, a calculating unit configured to determine an operating period of the battery cell based on the current of the battery cell, and calculate a comparison value for the battery cell by normalizing the voltage of the battery cell, and a diagnosing unit configured to diagnose a state of the battery cell by comparing the comparison value of the battery cell with a reference value.

According to an embodiment, the comparison value of the battery cell may include first data that is a value obtained by normalizing an average voltage output value for each preset first period for the battery cell, second data that is an amount of change of the first data, and third data that is a value obtained by normalizing the second data.

According to an embodiment, the diagnosing unit may be further configured to diagnose the state of the battery cell by comparing the first, second, and third data with first, second, and third reference values, respectively.

According to an embodiment, the comparison value of the battery cell may include fourth data that is a value obtained by normalizing an average voltage change output value for each preset period for the battery cell, fifth data that is an amount of change of the fourth data, and sixth data that is a value obtained by normalizing the fifth data.

According to an embodiment, the diagnosing unit may be further configured to diagnose the state of the battery cell by comparing the fourth, fifth, and sixth data with fourth, fifth, and sixth reference values, respectively.

According to an embodiment, the state of the battery cell may include a voltage rise and drop in charging, discharging, and idle periods of the battery cell and long relaxation.

According to an embodiment, the calculating unit may be further configured to calculate the comparison value when a size of a period for performing normalization on the voltage of the battery cell is less than a reference value.

According to an embodiment, the calculating unit may be further configured to change the size of the period to recalculate the comparison value when the size of the period for performing normalization on the voltage of the battery cell is greater than or equal to the reference value.

According to an embodiment, the calculating unit may be further configured to determine whether the operating period of the battery cell is included in any one of a charging period, a discharging period, or an idle period, based on the current of the battery cell.

According to an embodiment, the battery cell may include a battery cell previously diagnosed as abnormal through a principal component analysis (PCA).

According to an embodiment, an abnormal type of the battery cell may include on including lithium precipitation, an internal short-circuit, and a battery tab break.

According to an embodiment, the diagnosing unit may be further configured to classify the abnormal type of the battery cell as one including the lithium precipitation when a voltage behavior of the battery cell is at least one of a charging voltage drop, an idle voltage drop after charging, a discharging voltage rise, or an idle voltage rise after discharging.

According to an embodiment, the diagnosing unit may be further configured to classify the abnormal type of the battery cell as one including the internal short-circuit when the voltage behavior of the battery cell is at least one of a charging and discharging voltage drop or an idle voltage drop after charging and discharging.

According to an embodiment, the diagnosing unit may be further configured to classify the abnormal type of the battery cell as on including the battery tab break when the voltage behavior of the battery cell is at least one of a discharging voltage drop or a charging and discharging voltage rise.

A battery management method according to an embodiment disclosed herein includes measuring a voltage and a current of a battery cell, determining an operating period of the battery cell based on the current of the battery cell, calculating a comparison value for the battery cell by normalizing the voltage of the battery cell, and diagnosing a state of the battery cell by comparing a comparison value of the battery cell with a reference value.

According to an embodiment, the comparison value of the battery cell may include first data that is a value obtained by normalizing an average voltage output value for each preset first period for the battery cell, second data that is an amount of change of the first data, and third data that is a value obtained by normalizing the second data.

According to an embodiment, the diagnosing of the state of the battery cell may include comparing the first, second, and third data with first, second, and third reference values, respectively.

According to an embodiment, the comparison value of the battery cell may include fourth data that is a value obtained by normalizing an average voltage change output value for each preset period for the battery cell, fifth data that is an amount of change of the fourth data, and sixth data that is a value obtained by normalizing the fifth data.

According to an embodiment, the diagnosing of the state of the battery cell may include diagnosing the state of the battery cell by comparing the fourth, fifth, and sixth data with fourth, fifth, and sixth reference values, respectively.

Advantageous Effects

A battery management apparatus and method according to an embodiment disclosed herein may early predict a failure of a battery cell by early diagnosing an unstable behavior of the battery cell and classifying a type of the unstable behavior, thereby preventing an accident.

MODE FOR INVENTION

Figure 1:
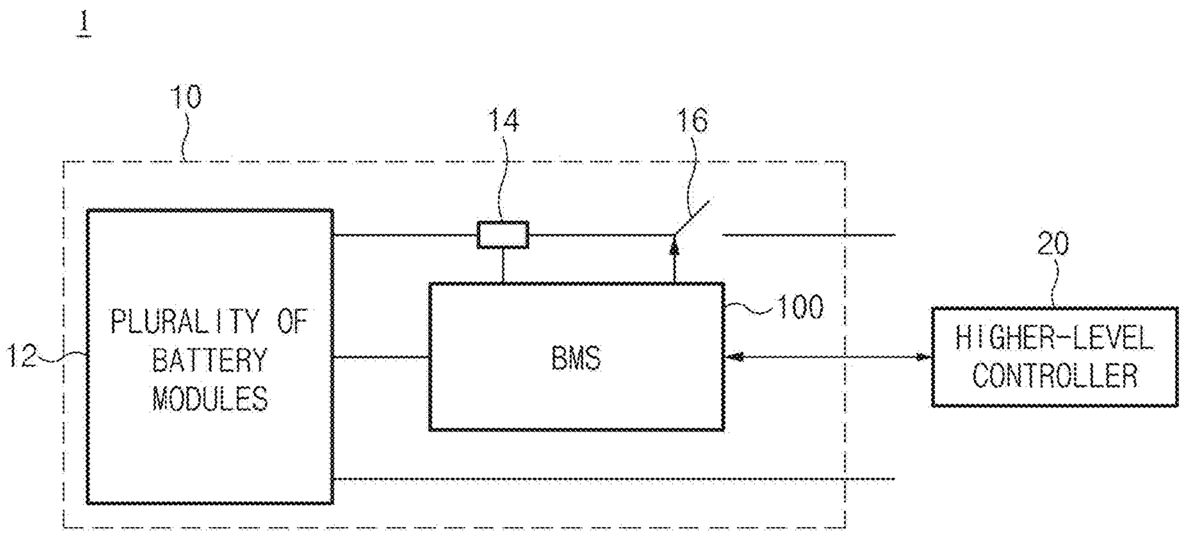
FIG. 1 is a block diagram of a battery control system including a battery management apparatus according to an embodiment disclosed herein.

Hereinafter, various embodiments disclosed herein will be described in detail with reference to the accompanying drawings. In this document, identical reference numerals will be used for identical components in the drawings, and the identical components will not be redundantly described.

For various embodiments disclosed herein, specific structural or functional descriptions are only exemplified for the purpose of describing the embodiments, and various embodiments disclosed herein may be implemented in various forms, and should not be construed as being limited to the embodiments described herein.

As used in various embodiments, the terms "1st, "2nd", "first", "second", or the like may modify various components regardless of importance, and do not limit the components. For example, a first component may be named as a second component without departing from the right scope of an embodiment disclosed herein, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments disclosed herein.

FIG. 1 is a block diagram of a battery control system including a battery management apparatus according to an embodiment disclosed herein.

More specifically, FIG. 1 schematically shows a battery control system 1 including a battery pack 10 and a higher-level controller 20 included in a higher-level system according to an embodiment disclosed herein.

As shown in FIG. 1, the battery pack 10 may include a plurality of battery modules 12, a sensor 14, a switching unit 16, and a battery management system 100. The battery pack 10 may include the battery module 12, the sensor 14, the switching unit 16, and the battery management system 100 provided in plural.

The plurality of battery modules 12 may include at least one chargeable/dischargeable battery cells. In this case, the plurality of battery modules 12 may be connected in series or in parallel.

The sensor 14 may detect current flowing in the battery pack 10. In this case, a detected signal may be transmitted to the battery management system 100.

The switching unit 16 may be connected in series to a (+) terminal side or a (−) terminal side of the battery module 12 to control the charging/discharging current flow of the battery module 12. For example, the switching unit 16 may use at least one relay, a magnetic contactor, etc., according to the specifications of the battery pack 10.

The battery management system 100 may monitor the voltage, current, temperature, etc., of the battery pack 10 to perform control and management to prevent overcharging and overdischarging, etc., and may include, for example, an RBMS (Rack Battery Management System).

The battery management system 100, which is an interface for receiving measurement values of the above-described various parameter values, may include a plurality of terminals and a circuit, etc., connected thereto to process input values. The battery management system 100 may control on/off of the switching unit 16, e.g., a relay, a contactor, etc., and may be connected to the battery module 12 to monitor the state of each battery module 12.

Meanwhile, in the battery management system 100 disclosed herein, as will be described later, comparison values may be calculated through statistical analysis (e.g., a normalization operation, etc.) with respect to a voltage of a battery cell measured through a separate program, and may be analyzed to diagnose a state of the battery cell.

The higher-level controller 20 may transmit a control signal for controlling the battery module 12 to the battery management system 100. Thus, the battery management system 100 may be controlled in terms of an operation thereof based on a signal applied from the higher-level controller 20. Also, the battery module 12 may be a component included in an energy storage system (ESS). In this case, the higher-level controller 20 may be a controller of a battery bank (BBMS) including the plurality of packs 10 or an ESS controller for controlling the entire ESS including a plurality of banks. However, the battery pack 10 is not limited to such a purpose.

Such configurations of the battery pack 10 and the battery management system 100 are well-known configurations, and thus will not be described in detail.

Figure 2:
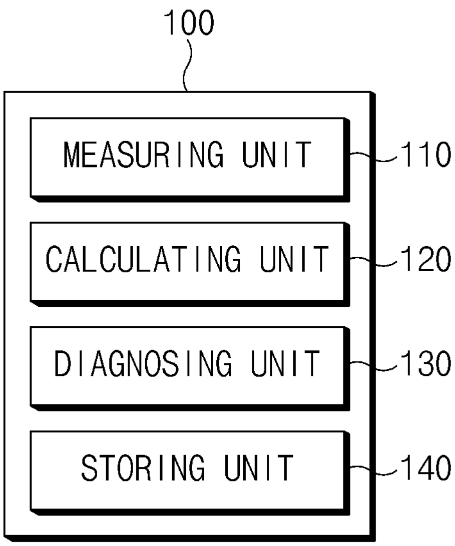
FIG. 2 is a block diagram illustrating a structure of a battery management apparatus, according to an embodiment disclosed herein.

FIG. 2 is a block diagram illustrating a structure of a battery management apparatus, according to an embodiment disclosed herein.

Referring to FIG. 2, the battery management apparatus 100 disclosed herein may include a measuring unit 110, a calculating unit 120, a diagnosing unit 130, and a storing unit 140.

The measuring unit 110 may measure a voltage and a current of the battery cell. In this case, the measuring unit 110 may measure the voltage and current of the battery cell at predetermined intervals. The measuring unit 110 may store the measured voltage and current in the storing unit 140.

The calculating unit 120 may determine an operating period of the battery cell based on the current of the battery cell, and calculate a comparison value for each battery cell by normalizing the voltage of the battery cell. In this case, the battery cell may include a battery cell previously diagnosed abnormal through principal component analysis (PCA).

More specifically, the calculating unit 120 may determine whether the operating period of the battery cell is included in any one of a charging period, a discharging period, or an idle period, based on the current of the battery cell. For example, the calculating unit 120 may determine whether the battery cell is in the charging or discharging state according to a direction (+/−) of the current of the battery cell, and determine that the battery cell is in the idle period when the current of the battery cell is 0.

A comparison value of the battery cell calculated by the calculating unit 120 may include first data that is a value obtained by normalizing an average voltage output value for each preset period (window) for each battery cell, second data that is an amount of change of the first data, and third data that is a value obtained by normalizing the second data. In addition, a comparison value of the battery cell calculated by the calculating unit 120 may include fourth data that is a value obtained by normalizing an amount of change of a voltage for each preset period for each battery cell, fifth data that is an amount of change of the fourth data, and sixth data that is a value obtained by normalizing the fifth data. For example, assuming that the measuring unit 110 measures the voltage of the battery cell every 1 second for 1800 seconds, a period (window) for performing a normalization operation may be set to 200 seconds and thus may be divided into a total of 9 periods. In this case, the preset period may include 200 pieces of voltage data. However, the present disclosure is not limited thereto, and the above-described preset period may be determined at random depending on a user's need.

The calculating unit 120 may calculate a comparison value when a size of a period, i.e., a window, for performing the normalization operation on the voltage of the battery cell is less than a reference value. This is because an excessively large size of the window may degrade the accuracy of calculation. Thus, the calculating unit 120 may change the size of the period to recalculate the comparison value when the size of the window for performing the normalization operation on the voltage of the battery cell is greater than or equal to the reference value. For example, the size of the window may be reduced by 10.

The diagnosing unit 130 may compare the comparison values of the battery cell with the reference value to diagnose the state of the battery cell. In this case, the diagnosing unit 130 may diagnose the state of the battery cell by comparing the first to third data calculated by the calculating unit 120 with set first to third reference values. The diagnosing unit 130 may also diagnose the state of the battery cell by comparing the fourth to sixth data with the fourth to sixth reference values.

A voltage behavior of the battery cell, which may be diagnosed by the diagnosing unit 130, may include voltage rise and drop in the charging, discharging, and idle periods of the battery cell and long relaxation. This will be described in detail with reference to FIG. 9. An abnormal type of the battery cell, which may be classified through the diagnosing unit 130, may include lithium precipitation, internal short-circuit, and battery tab break.

For example, the diagnosing unit 130 may classify the abnormal type of the battery cell as lithium precipitation when the voltage behavior of the battery cell is at least one of charging voltage drop, idle voltage drop after charging, discharging voltage rise, or idle voltage rise after discharging. The diagnosing unit 130 may also classify the abnormal type of the battery cell as internal short-circuit when the voltage behavior of the battery cell is at least one of charging and discharging voltage drop or idle voltage drop after charging and discharging. The diagnosing unit 130 may also classify the abnormal type of the battery cell as battery tab break when the voltage behavior of the battery cell is at least one of discharging voltage drop or charging and discharging voltage rise. However, an abnormal type that may be classified in the battery management apparatus 100 according to an embodiment disclosed herein is not limited thereto, and various other abnormal types may be classified according to the voltage behavior of the battery cell.

The storing unit 140 may store measurement data such as a voltage, a current, etc., of the battery cell. The storing unit 140 may store the comparison values calculated by the calculating unit 120, e.g., the first to sixth data and the first to sixth reference values.

Meanwhile, the battery management apparatus 100 according to an embodiment disclosed herein is described as including the storing unit 140 in FIG. 2, but the battery management apparatus 100 may include a communication unit (not shown) instead of the storing unit 140. In this case, the battery management apparatus 100 may operate by storing various data such as comparison value data, reference values, etc., for the battery cell in an external server and transmitting and receiving the data through a communication unit.

As such, the battery management apparatus according to an embodiment disclosed herein may early predict a failure of a battery cell by early diagnosing an unstable behavior of the battery cell and classifying a type of the unstable behavior, thereby preventing an accident.

Figure 3:
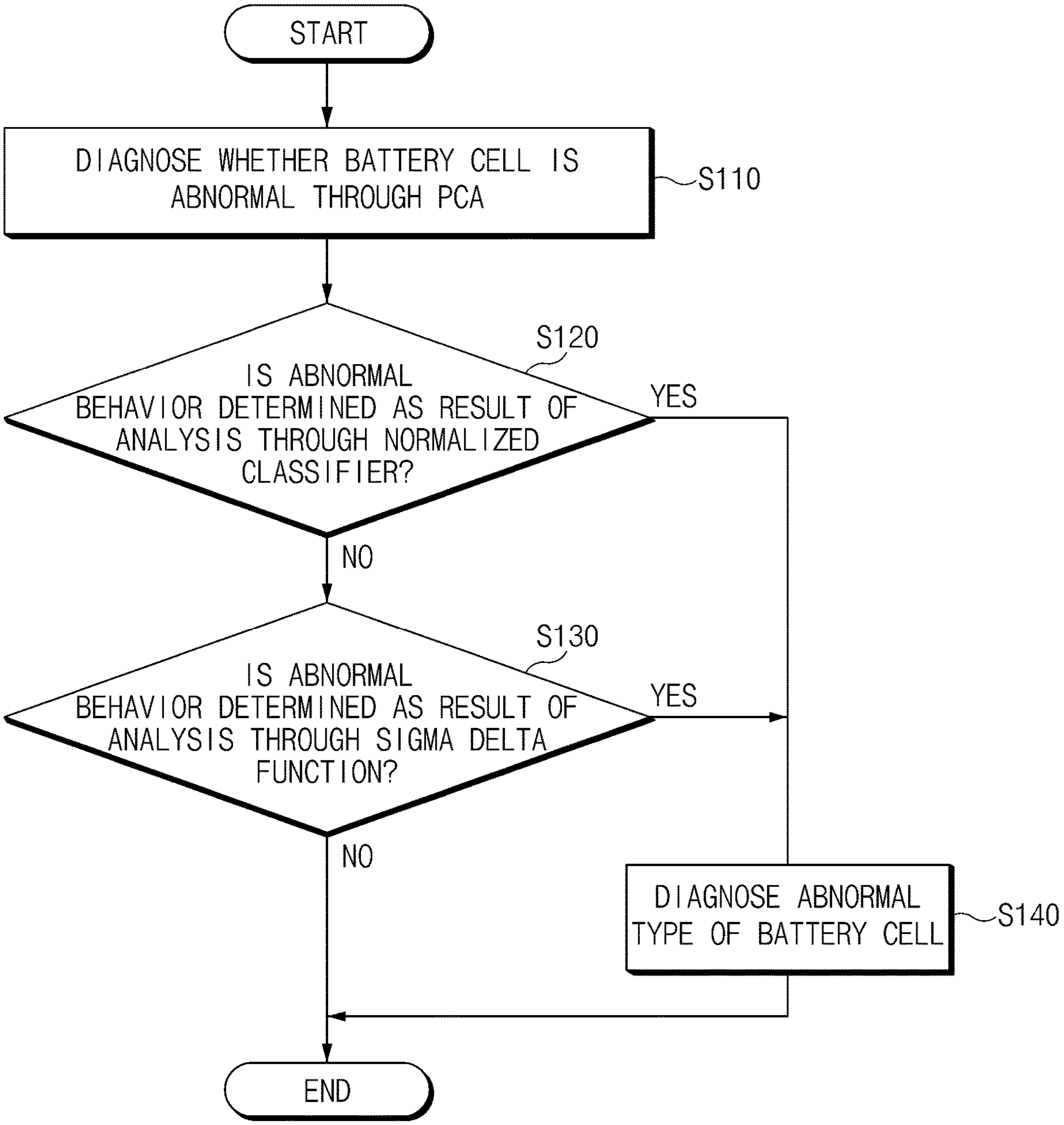
FIG. 3 is a flowchart of a battery management method according to an embodiment disclosed herein.

FIG. 3 is a flowchart of a battery management method according to an embodiment disclosed herein.

Referring to FIG. 3, the battery management method according to an embodiment disclosed herein may diagnose whether the battery cell is abnormal through PCA, in operation S110. That is, in operation S110, battery cells determined to be abnormal through a conventional PCA method may be extracted.

The behavior of the battery cell may be analyzed by a normalized classifier to determine an abnormal behavior, in operation S120. In this case, the normalized classifier may be performed by calculating the first data that is a value obtained by normalizing an average voltage output value for each preset period (window) for each battery cell, the second data that is an amount of change of the first data, and the third data that is a value obtained by normalizing the second data, and comparing the first to third data with the reference values, as described with reference to FIG. 2.

When at least one of the first to third data is greater than the first to third reference values (i.e., the abnormal behavior may be determined by the normalized classifier, YES) in operation S120, the abnormal type of the battery cell may be diagnosed based on the measured current and voltage of the battery cell, in operation S140. In this case, the abnormal behavior of the battery cell may be determined based on the current (+, −, or 0) and voltage (+ or −) of the battery cell.

On the other hand, when it is determined that at least one of the first to third data is less than the first to third reference values in operation S120 or classification is not performed (NO), operation S130 may be performed. In operation S130, the behavior of the battery cell may be analyzed based on a sigma delta function to determine the abnormal behavior.

In this case, the sigma delta function may be performed by calculating the fourth data that is a value obtained by normalizing an amount of change of a voltage for each preset period for each battery cell, the fifth data that is an amount of change of the fourth data, and the sixth data that is a value obtained by normalizing an average of the fifth data and comparing the fourth to sixth data with the reference values, for each battery cell, as described with reference to FIG. 2.

When at least one of the fourth to sixth data is greater than the fourth to sixth reference values (i.e., the abnormal behavior may be determined by the sigma delta function, YES) in operation S130, the abnormal type of the battery cell may be diagnosed based on the measured current and voltage of the battery cell, in operation S140. In this case, the abnormal behavior of the battery cell may be determined based on the current (+, −, or 0) and voltage (+ or −) of the battery cell.

On the other hand, when it is determined that at least one of the fourth to sixth data is less than the fourth to sixth reference values in operation S130 or classification is not performed (NO), it may mean that the battery cell is normal, and thus the process is terminated.

Figure 4:
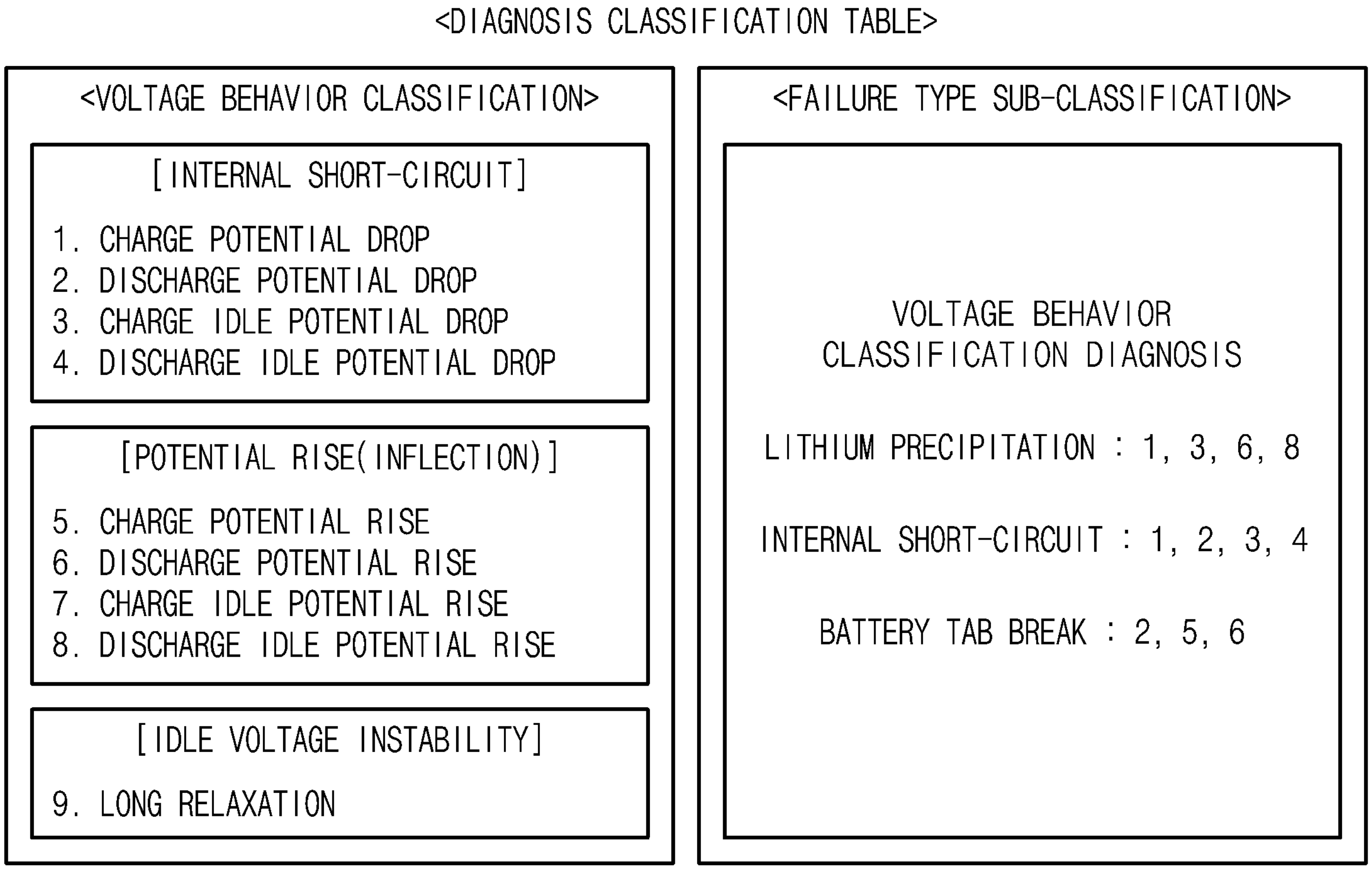
FIG. 4 illustrates a diagnostic classification table indicating a type that may be classified by a battery management apparatus according to an embodiment disclosed herein.

FIG. 4 illustrates a diagnostic classification table indicating a type that may be classified by a battery management apparatus according to an embodiment disclosed herein.

Referring to FIG. 4, the voltage behavior that may be classified by the battery management apparatus according to an embodiment disclosed herein may include potential drop in charging and discharging, idle potential drop after charging and discharging, potential rise in charging and discharging, idle potential rise after charging and discharging, and long relaxation.

In this case, when the voltage behavior of the battery cell belongs to one of 1. charging potential drop, 3. idle potential drop after charging, 6. discharging potential rise, and 8. idle potential rise after discharging, the abnormal type may be classified as "lithium precipitation". When the voltage behavior of the battery cell belongs to one of 1. charging potential drop, 2. discharging potential drop, 3. idle potential drop after charging, 4. idle potential drop after discharging, the abnormal type may be classified as "internal short-circuit". When the voltage behavior of the battery cell belongs to one of 2. discharging potential drop, 5. charging potential rise, and 6. discharging potential rise, the abnormal type may be classified as "battery tab break". However, FIG. 4 merely shows an example, and an abnormal type that may be classified in the battery management apparatus according to an embodiment disclosed herein is not limited thereto, and various other abnormal types may be classified according to the voltage behavior of the battery cell.

Figure 5:
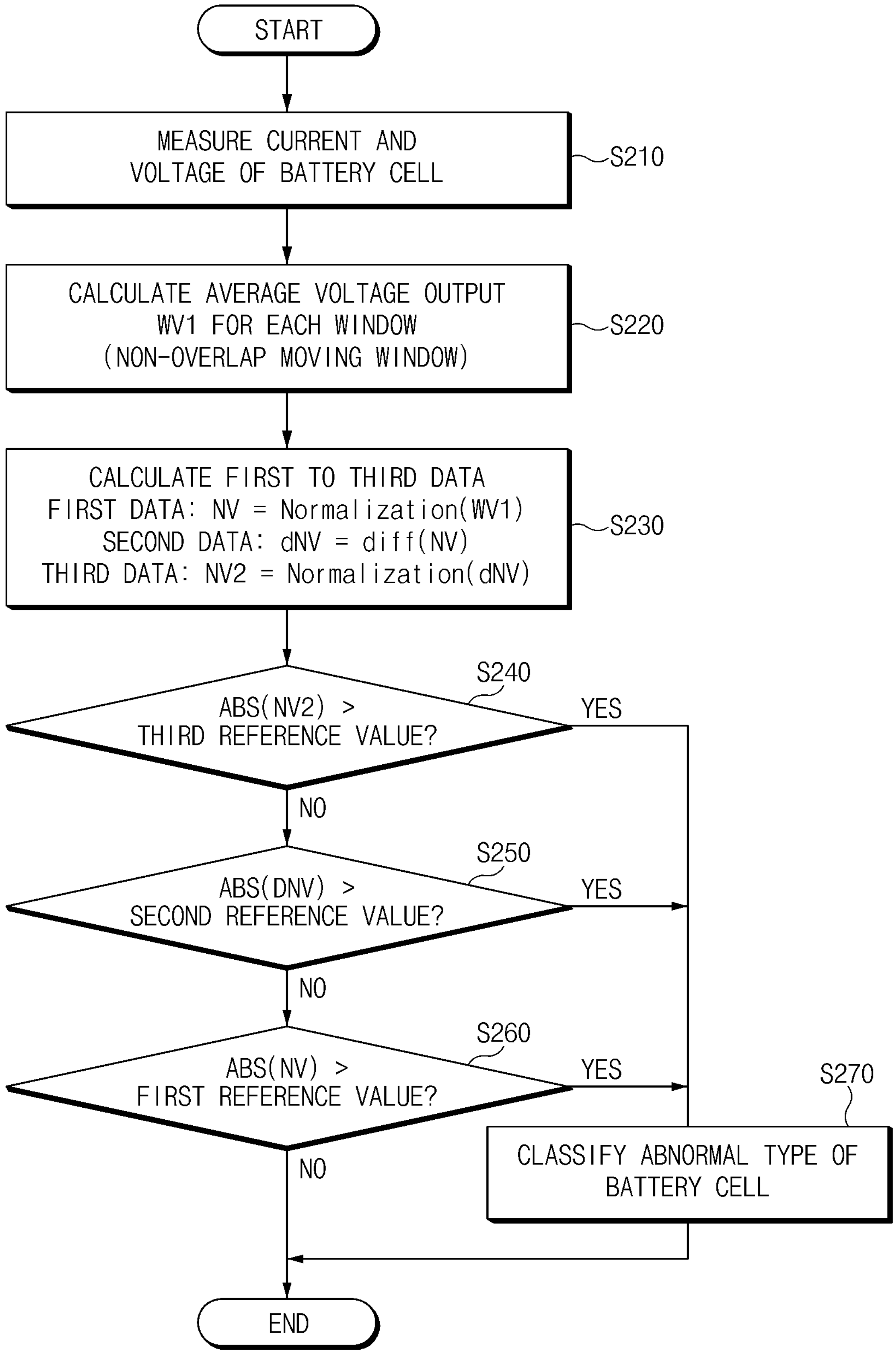
FIG. 5 is a flowchart illustrating a battery management method according to an embodiment disclosed herein.

FIG. 5 is a flowchart illustrating a battery management method according to an embodiment disclosed herein.

Referring to FIG. 5, the normalized classifier described with reference to FIG. 3 in a battery management method according to an embodiment disclosed herein is shown. The normalized classifier may first measure the current and voltage of the battery cell in operation S210. In this case, in operation S210, the current and voltage of the battery cell may be measured at specific intervals (e.g., 1 second) for a preset period (e.g., 1800 seconds).

An average voltage output WV1 for each window (period) may be calculated in operation S220. In this case, the window may be a non-overlap moving window, and a size thereof may be, for example, 200 seconds.

Next, in operation S230, the first to third data may be calculated. In this case, first data NV may be a value obtained by normalizing the average voltage output WV1 for each window (Normalization(WV1)) calculated in operation S220. Second data dNV may be an amount of change of the first data, e.g., a value obtained by differentiating the first data (diff(NV)). Third data NV2 may be a value obtained by normalizing the second data (Normalization(dNV)).

The third data NV2 may be compared with the third reference value, in operation S240. When the third data is greater than the third reference value (YES), the battery cell may be determined as an abnormal battery cell and an abnormal type of the battery cell may be classified, in operation S270. In this case, after the abnormal behavior may be determined based on the measured current and voltage in operation S210, the abnormal type may be classified according to the diagnosis classification table of FIG. 4.

For example, after the charging, discharging, or idle period of the battery cell is determined according to whether the current of the battery cell is +, −, or 0, whether the voltage of the battery cell changes in a + or − direction, i.e., a voltage change of the battery cell may be detected to determine whether the voltage of the battery cell rises or drops.

When the third data is less than the third reference value (NO) in operation S240, the second data dNV may be compared with the second reference value, in operation S250. When the second data is greater than the second reference value (YES), the battery cell may be determined as an abnormal battery cell and an abnormal type of the battery cell may be classified, in operation S270. Also in this case, after the abnormal behavior may be determined based on the measured current and voltage in operation S210, the abnormal type may be classified according to the diagnosis classification table of FIG. 4.

Next, when the second data is less than the second reference value (NO) in operation S250, the first data NV may be compared with the first reference value, in operation S260. When the first data is greater than the first reference value (YES), the battery cell may be determined as an abnormal battery cell and an abnormal type of the battery cell may be classified, in operation S270. Also in this case, after the abnormal behavior may be determined based on the measured current and voltage in operation S210, the abnormal type may be classified according to the diagnosis classification table of FIG. 4.

While diagnosis is performed by sequentially comparing the third to first data with the third to first reference values in operations S240 to S260, the battery management method disclosed herein is not limited thereto and an analysis order of the first to third data may be changed. For example, the first to third reference values in operations S240 to S260 may be set at random by a user or may be calculated by the battery management apparatus.

Figure 6:
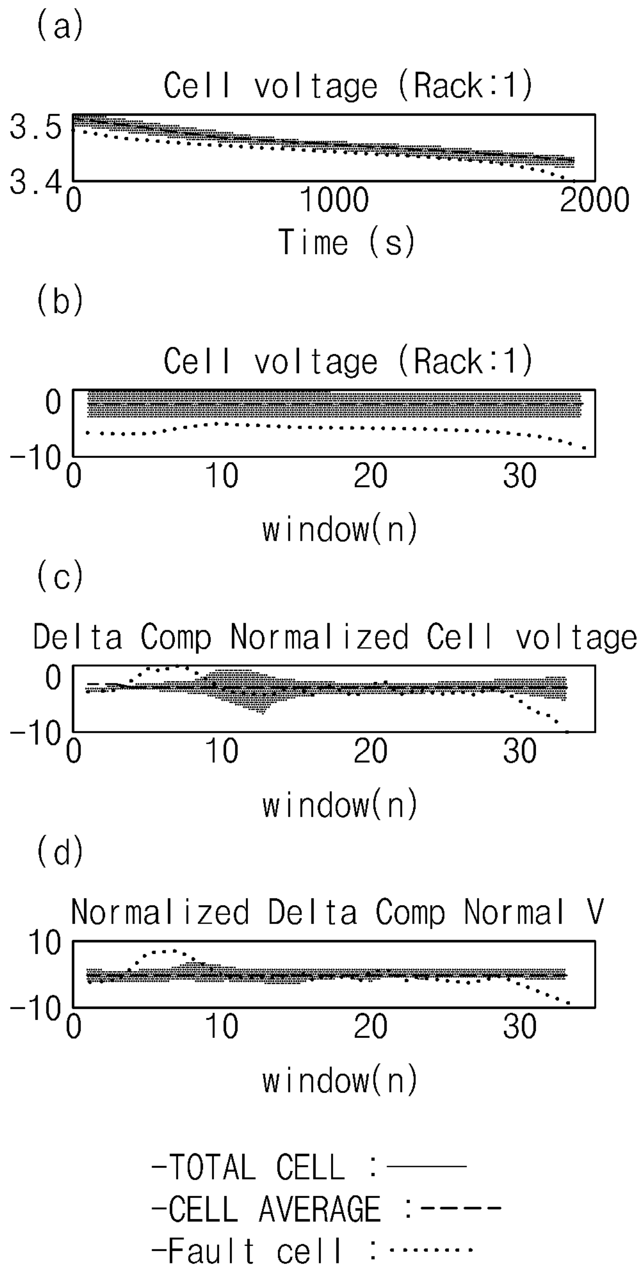
FIG. 6 illustrates graphs in discharging potential rise of a battery cell calculated using a battery management method according to an embodiment disclosed herein.

FIG. 6 illustrates graphs in discharging potential rise of a battery cell calculated using a battery management method according to an embodiment disclosed herein.

In a graph (a) of FIG. 6, a horizontal axis indicates time (second) and a vertical axis indicates a voltage V of a battery cell. In graphs (b) to (d) of FIG. 6, a horizontal axis indicates a window number n, and a vertical axis indicates a normalized value of a voltage of a battery cell and a differential value of the normalized value.

Referring to the graph (a) of FIG. 6, for a battery cell having discharging potential rise occurred, a shape may be seen in which a voltage rises by a predetermined magnitude after 600 seconds. However, a shape change is not large, and thus an abnormal behavior is not easy to determine merely with the voltage graph of the battery cell.

Moreover, referring to the graph (b) of FIG. 6, for the measured voltage of the battery cell shown in (a) of FIG. 6, an average voltage is calculated for each window and normalized (the first data). In this case, as shown in the graph (b) of FIG. 6, for a battery cell having discharging potential rise occurred, a change is noticeable when compared to another battery cell.

The graph (c) of FIG. 6 shows a differential value (the second data) of values of the graph (b) of FIG. 6, and the graph (d) of FIG. 6 shows normalized values (the third data) of the graph (c) of FIG. 6. Referring to the graphs (c) and (d) of FIG. 6, for a battery cell having discharging potential rise occurred, a shape in a peak form appears in a window #8, a window #13, etc.

As such, referring to the graphs (a) to (d) of FIG. 6, when compared to a graph showing a merely measured voltage of a battery cell, the first to third data taking statistical values in the voltage of the battery cell has a prominent shape change of a battery cell having the discharging potential rise occurred. Thus, by comparing the graphs (b) to (d) regarding the first to third data with the reference values, abnormality of the battery cell may be easily and accurately detected.

Figure 7:
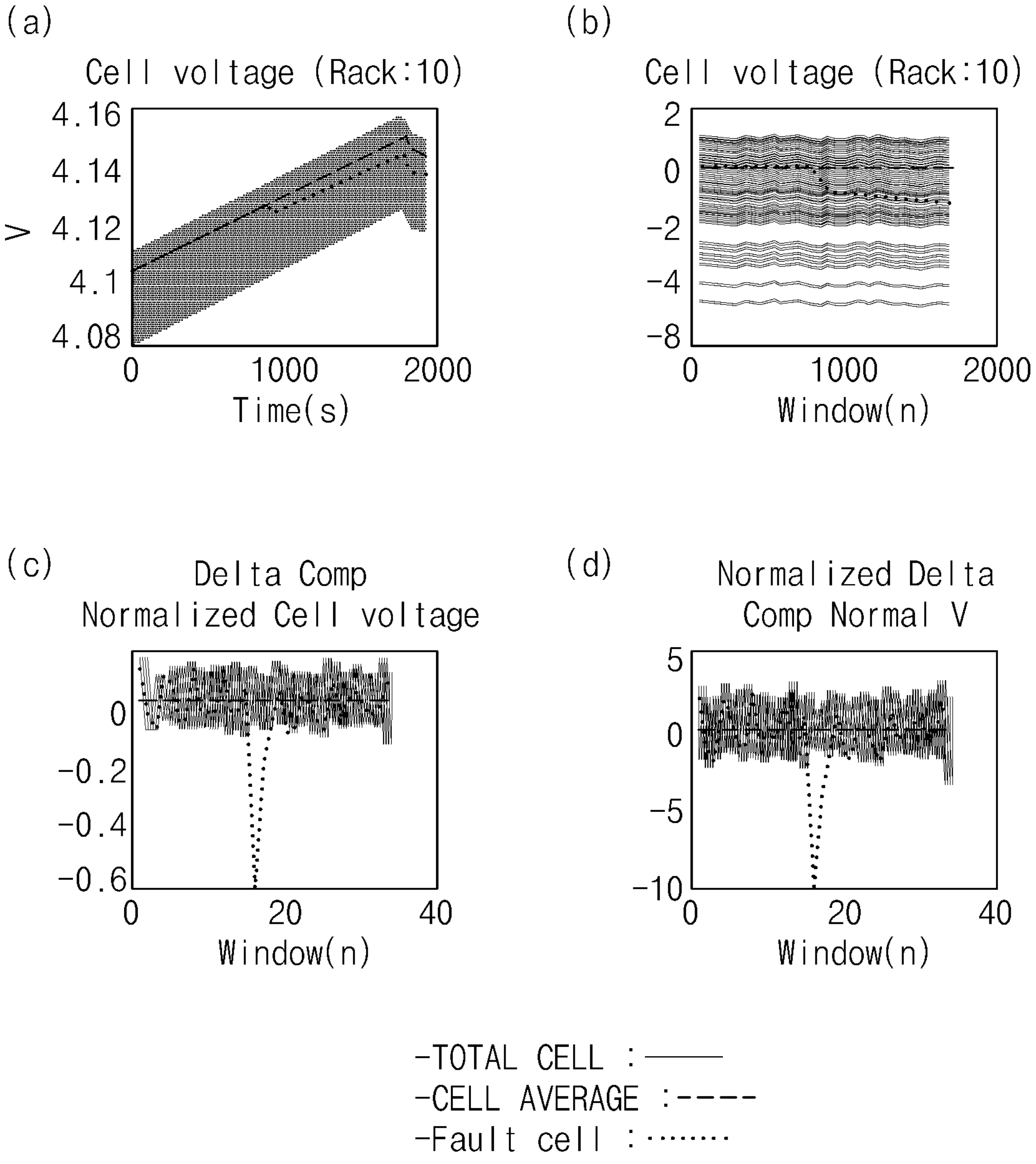
FIG. 7 illustrates graphs in charging potential drop of a battery cell calculated using a battery management method according to an embodiment disclosed herein.

FIG. 7 illustrates graphs in charging potential drop of a battery cell calculated using a battery management method according to an embodiment disclosed herein.

In a graph (a) of FIG. 7, a horizontal axis indicates time (second) and a vertical axis indicates a voltage V of a battery cell. In graphs (b) to (d) of FIG. 7, a horizontal axis indicates a window number n, and a vertical axis indicates a normalized value of a voltage of a battery cell and differential values of the normalized value.

First, referring to the graph (a) of FIG. 7, for a battery cell having charging potential drop occurred, a shape may be seen in which a voltage drops by a predetermined magnitude at a point of about 1000 seconds. However, similarly with FIG. 6, a shape change is not large, and thus an abnormal behavior is not easy to determine merely with the voltage graph of the battery cell.

Moreover, referring to the graph (b) of FIG. 7, for the measured voltage of the battery cell shown in (a) of FIG. 7, an average voltage is calculated for each window and normalized (the first data). In this case, as shown in the graph (b) of FIG. 7, for a battery cell having charging potential drop occurred, a change is noticeable when compared to another battery cell.

The graph (c) of FIG. 7 shows a differential value (the second data) of values of the graph (b) of FIG. 7, and the graph (d) of FIG. 7 shows normalized values (the third data) of the graph (c) of FIG. 7. In particular, referring to the graphs (c) and (d) of FIG. 7, for a battery cell having charging potential drop occurred, shapes in a peak form appear in multiple windows.

As such, referring to the graphs (a) to (d) of FIG. 7, when compared to a graph showing a merely measured voltage of a battery cell, the first to third data taking statistical values in the voltage of the battery cell has a prominent shape change of a battery cell having the charging potential drop occurred. Thus, by comparing the graphs (b) to (d) regarding the first to third data with the reference values, abnormality of the battery may be easily and accurately detected.

Figure 8:
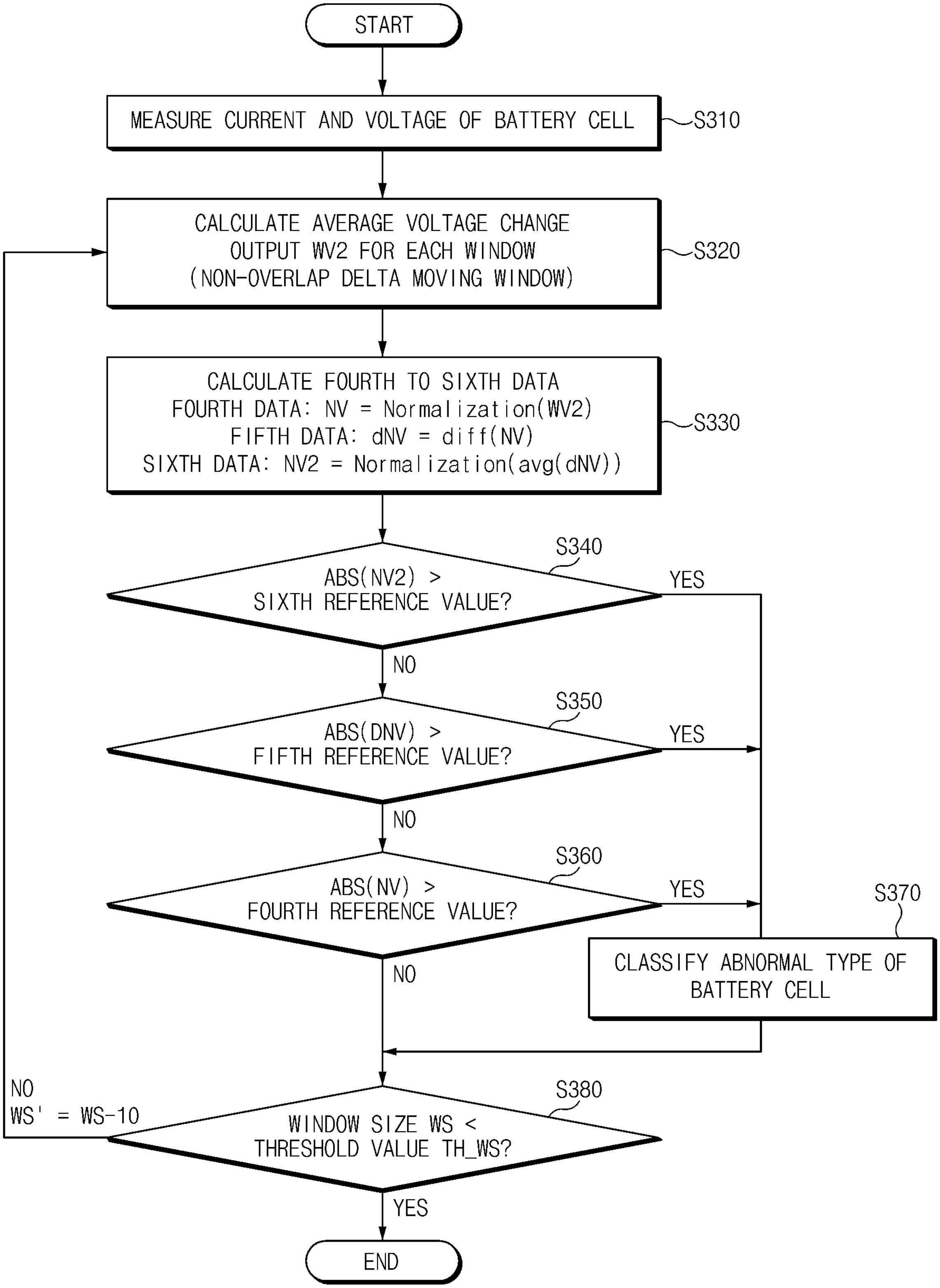
FIG. 8 is a flowchart illustrating a battery management method according to an embodiment disclosed herein.

FIG. 8 is a flowchart illustrating a battery management method according to an embodiment disclosed herein.

Referring to FIG. 8, the sigma delta function described with reference to FIG. 3 in a battery management method according to an embodiment disclosed herein is shown. The sigma delta function may first measure the current and voltage of the battery cell in operation S310. In this case, in operation S310, the current and voltage of the battery cell may be measured at specific intervals (e.g., 1 second) for a preset period (e.g., 1800 seconds).

An average voltage change output WV2 for each window (period) may be calculated in operation S320. In this case, the window may be a non-overlap moving window, and a size thereof may be, for example, 200 seconds.

Next, in operation S330, the fourth to sixth data may be calculated. In this case, fourth data NV may be a value obtained by normalizing the average voltage change output WV2 for each window (Normalization(WV2)) calculated in operation S320. Fifth data dNV may be an amount of change of the fourth data, e.g., a value obtained by differentiating the fourth data (diff(NV)). Sixth data NV2 may be a value obtained by normalizing the fifth data (Normalization (dNV)).

The sixth data NV2 may be compared with the sixth reference value, in operation S340. When the sixth data is greater than the sixth reference value (YES), the battery cell may be determined as an abnormal battery cell and an abnormal type of the battery cell may be classified, in operation S370. In this case, after the abnormal behavior may be determined based on the measured current and voltage in operation S310, the abnormal type may be classified according to the diagnosis classification table of FIG. 4.

For example, after the charging, discharging, or idle period of the battery cell is determined according to whether the current of the battery cell is +, −, or 0, whether the voltage of the battery cell changes in a + or − direction, i.e., a voltage change of the battery cell may be detected to determine whether the voltage of the battery cell rises or drops.

When the sixth data is less than the sixth reference value (NO) in operation S340, the fifth data dNV may be compared with the fifth reference value, in operation S350. When the fifth data is greater than the fifth reference value (YES), the battery cell may be determined as an abnormal battery cell and an abnormal type of the battery cell may be classified, in operation S370. Also in this case, after the abnormal behavior may be determined based on the measured current and voltage in operation S310, the abnormal type may be classified according to the diagnosis classification table of FIG. 4.

Next, when the fifth data is less than the fifth reference value (NO) in operation S350, the fourth data NV may be compared with the fourth reference value, in operation S360. When the fourth data is greater than the fourth reference value (YES), the battery cell may be determined as an abnormal battery cell and an abnormal type of the battery cell may be classified, in operation S370. Also in this case, after the abnormal behavior may be determined based on the measured current and voltage in operation S310, the abnormal type may be classified according to the diagnosis classification table of FIG. 4.

While diagnosis is performed by sequentially comparing the sixth to fourth data with the sixth to fourth reference values in operations S340 to S360, the battery management method disclosed herein is not limited thereto and an analysis order of the fourth to sixth data may be changed. For example, the fourth to sixth reference values in operations S340 to S360 may be set at random by the user or may be calculated by the battery management apparatus.

In operation S380, when the abnormal behavior of the battery cell is not determined in operations S340 to S370, a window size WS may be compared with a reference value TH_WS. When the window size is greater than the reference value in operation S380, the window size may be adjusted by returning to operation S320. For example, the window size may be reduced by 10. That is, when the window size is too large, the accuracy of abnormal behavior determination is degraded, such that when the abnormal behavior is not detected during operations S340 to S370, the window size may be reduced to improve the accuracy of abnormality diagnosis.

Figure 9:
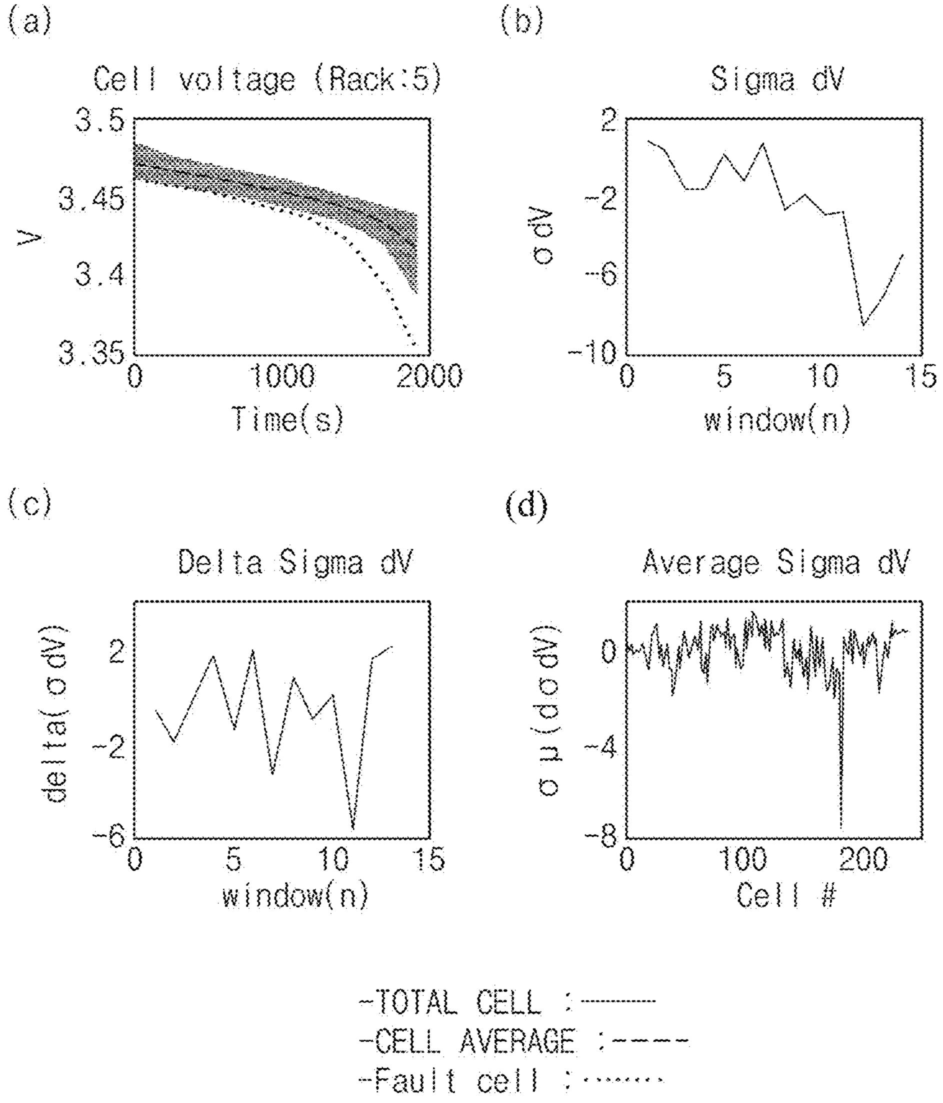
FIG. 9 illustrates graphs in discharging potential drop of a battery cell calculated using a battery management method according to an embodiment disclosed herein.

FIG. 9 illustrates graphs in discharging potential drop of a battery cell calculated using a battery management method according to an embodiment disclosed herein.

In a graph (a) of FIG. 9, a horizontal axis indicates time (second) and a vertical axis indicates a voltage V of a battery cell. In graphs (b) and (c) of FIG. 9, a horizontal axis indicates a window number n, and a vertical axis indicates a normalized value of a voltage change of a battery cell and a differential value of the normalized value. In a graph (d) of FIG. 9, a horizontal axis indicates a number # of a battery cell and a vertical axis indicates normalized values of values of the graph (c).

First, referring to the graph (a) of FIG. 9, for a battery cell having discharging potential drop occurred, a shape may be seen in which a voltage drops by a predetermined magnitude after about 1500 seconds. However, a shape change is not large, and thus an abnormal behavior is not easy to determine merely with the voltage graph of the battery cell.

The graph (b) of FIG. 9 shows a normalized value (the fourth data) of an average voltage change measured for each window with respect to a measured voltage of the battery cell shown in (a) of FIG. 9, and the graph (c) of FIG. 9 shows a differential value (the fifth data) of the values of the graph (b). In this case, as shown in the graphs (b) and (c) of FIG. 9, for a battery cell having discharging potential drop occurred, a voltage change noticeably occurs around a particular window (about 12).

The graph (d) of FIG. 9 shows comparison (the sixth data) between battery cells by normalizing the graph (c). In particular, referring to the graph (d) of FIG. 9, for a battery cell (a cell of about #180) having discharging potential drop occurred, when compared to other battery cells, a value is relatively largely reduced.

As such, referring to the graphs (a) to (d) of FIG. 9, when compared to a graph showing a merely measured voltage of a battery cell, the fourth to sixth data taking statistical values in the voltage of the battery cell has a prominent shape change of a battery cell having the discharging potential drop occurred. Thus, by comparing the graphs (b) to (d) of FIG. 9 regarding the fourth to sixth data with the reference values, abnormality of the battery cell may be easily and accurately detected.

Figure 10:
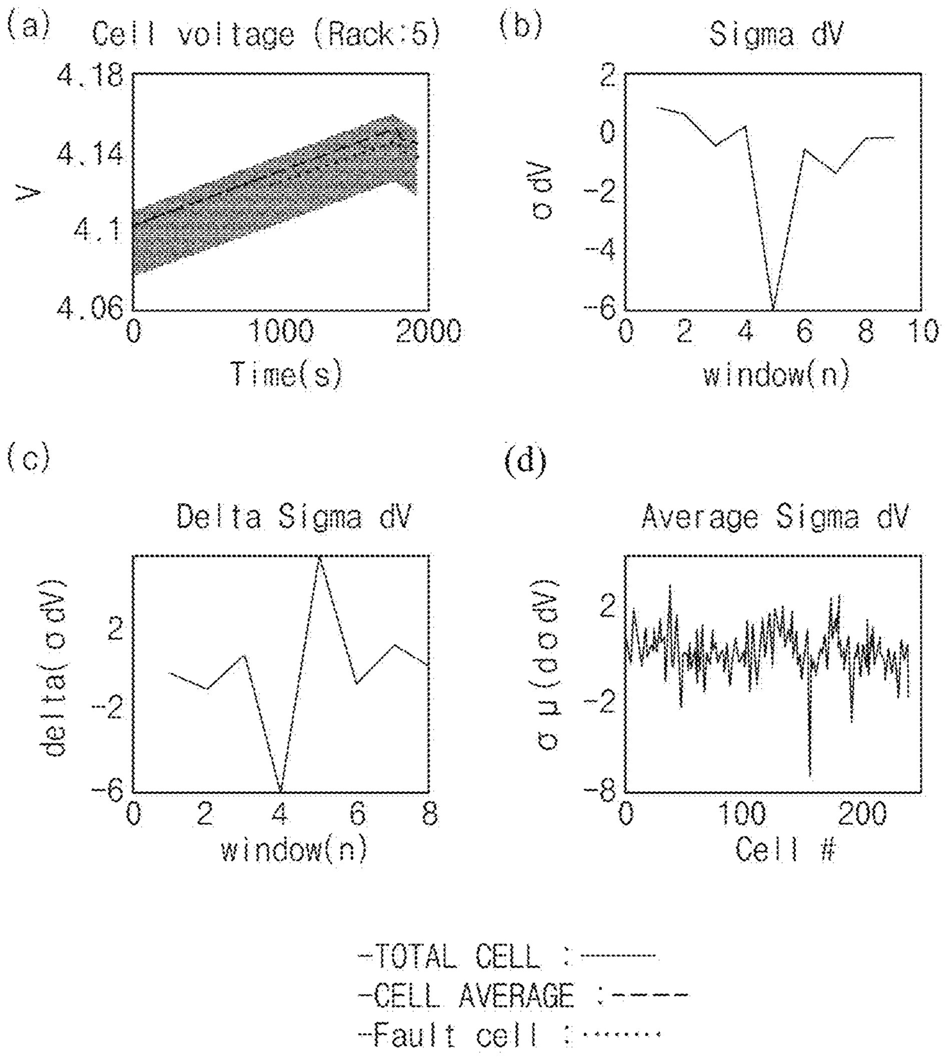
FIG. 10 illustrates graphs in charging potential drop of a battery cell calculated using a battery management method according to an embodiment disclosed herein.

FIG. 10 illustrates graphs in charging potential drop of a battery cell calculated using a battery management method according to an embodiment disclosed herein.

In a graph (a) of FIG. 10, a horizontal axis indicates time (second) and a vertical axis indicates a voltage V of a battery cell. In graphs (b) and (c) of FIG. 10, a horizontal axis indicates a window number n, and a vertical axis indicates a normalized value of a voltage change of a battery cell and a differential value of the normalized value. In a graph (d) of FIG. 10, a horizontal axis indicates a number # of a battery cell and a vertical axis indicates normalized values of values of the graph (c).

First, referring to the graph (a) of FIG. 10, for a battery cell having charging potential drop occurred, a shape may be seen in which a voltage drops by a predetermined magnitude after about 1000 seconds. However, a shape change is not large, and thus an abnormal behavior is not easy to determine merely with the voltage graph of the battery cell.

The graph (b) of FIG. 10 shows a normalized value (the fourth data) of an average voltage change measured for each window with respect to a measured voltage of the battery cell shown in (a) of FIG. 10, and the graph (c) of FIG. 10 shows a differential value (the fifth data) of the values of the graph (b). In this case, as shown in the graphs (b) and (c) of FIG. 10, for a battery cell having charging potential drop occurred, a voltage change noticeably occurs around a particular window (about 4-5).

The graph (d) of FIG. 10 shows comparison (the sixth data) between battery cells by normalizing the graph (c). In particular, referring to the graph (d) of FIG. 10, for a battery cell (a cell of about #150) having charging potential drop occurred, when compared to other battery cells, a shape appears in which a value is relatively largely reduced.

As such, referring to the graphs (a) to (d) of FIG. 10, when compared to a graph showing a merely measured voltage of a battery cell, the fourth to sixth data taking statistical values in the voltage of the battery cell has a prominent shape change of a battery cell having the charging potential drop occurred. Thus, by comparing the graphs (b) to (d) of FIG. 10 regarding the fourth to sixth data with the reference values, abnormality of the battery cell may be easily and accurately detected.

As such, the battery management method according to an embodiment disclosed herein may early predict a failure of a battery cell by early diagnosing an unstable behavior of the battery cell and classifying a type of the unstable behavior, thereby preventing an accident.

Figure 11:
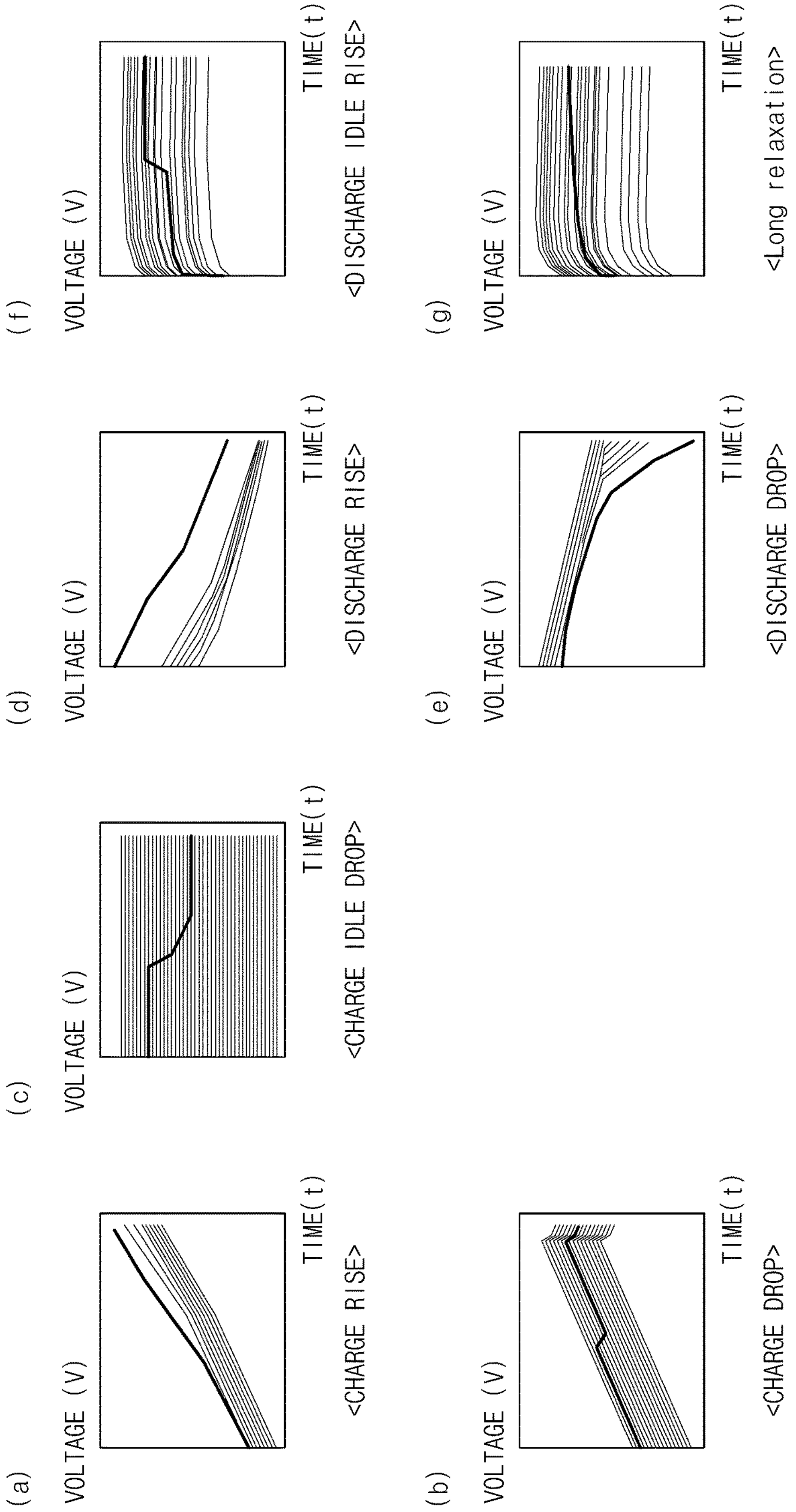
FIG. 11 illustrate graphs of abnormal types classified by a battery management apparatus, according to an embodiment disclosed herein.

FIG. 11 illustrate graphs of abnormal types classified by a battery management apparatus, according to an embodiment disclosed herein.

Referring to FIG. 11, a voltage shape of (a) charging potential rise, (b) charging potential drop, (c) idle potential drop after charging, (d) discharging potential rise, (e) discharging potential drop, (0 idle potential rise after discharging, and (g) long relaxation over time is shown.

As shown in FIG. 11, an abnormal voltage behavior of a battery cell is different from that of another cell in terms of a shape, but a shape thereof overlaps those of other most battery cells. Thus, it is difficult to accurately determine the abnormal behavior merely with the voltage shape over time.

Thus, the battery management apparatus disclosed herein may perform normalization and differentiation with respect to a voltage and an average voltage change in a specific period (window) of a battery cell to maximize a change caused by the abnormal behavior of the battery cell, thereby accurately and easily detecting the abnormal behavior of the battery cell and classifying the abnormal type based on the detected abnormal behavior.

Figure 12:
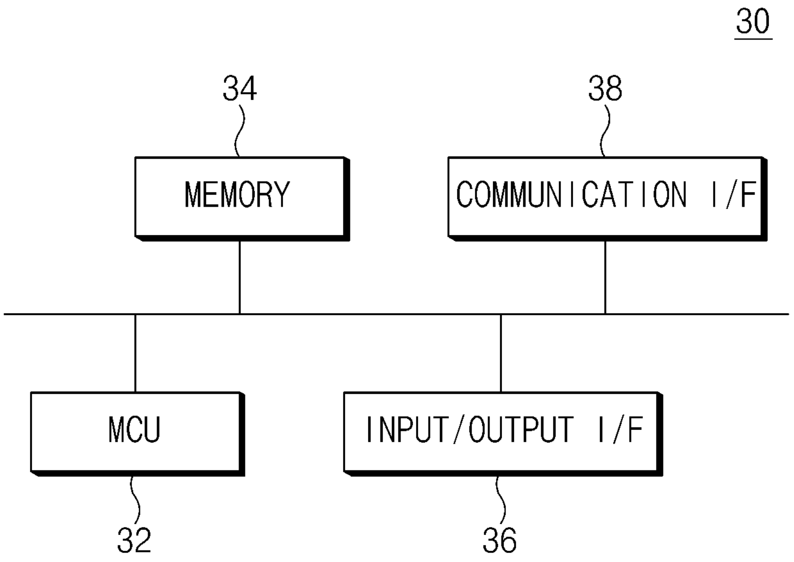
FIG. 12 is a block diagram illustrating a computing system that performs a battery management method according to an embodiment disclosed herein.

FIG. 12 is a block diagram illustrating a computing system that performs a battery management method according to an embodiment disclosed herein.

Referring to FIG. 12, a computing system 30 according to an embodiment disclosed herein may include an MCU (microcontroller unit) 32, a memory 34, an input/output interface (I/F) 36, and a communication I/F 38.

The MCU 32 may be a processor that executes various programs (e.g., a normalization program, a differential value calculation program, an abnormal behavior diagnosis and abnormal type classification program, etc.) stored in the memory 34, processes various data including voltage, current, etc., of a battery cell through these programs, and executes the above-described functions of the battery management apparatus shown in FIG. 2.

The memory 34 may store various programs regarding normalization and abnormal behavior and type classification of the battery cell. Moreover, the memory 34 may store various data such as a voltage, a current, normalized and differential data, etc., of each battery cell.

The memory 34 may be provided in plural, depending on a need. The memory 34 may be a volatile memory or a nonvolatile memory. For the memory 34 as the volatile memory, random access memory (RAM), dynamic RAM (DRAM), static RAM (SRAM), etc., may be used. For the memory 34 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 34 are merely examples and are not limited thereto.

The input/output I/F 36 may provide an interface for transmitting and receiving data by connecting an input device (not shown) such as a keyboard, a mouse, a touch panel, etc., and an output device such as a display (not shown), etc., with the MCU 32.

The communication I/F 38, which is a component capable of transmitting and receiving various data to and from a server, may be various types of devices capable of supporting wired or wireless communication. For example, a program for normalization and abnormal behavior and type classification of the battery cell or various data may be transmitted and received to and from a separately provided external server through the communication I/F 38.

As such, a computer program according to an embodiment disclosed herein may be recorded in the memory 34 and processed by the MCU 32, thus being implemented as a module that performs functions shown in FIG. 2.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the technical idea of the present disclosure, and various modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

| [Description of Reference Numerals] | |
|---|---|
| 1: Battery Control System | 10: Battery Pack |
| 12: Plurality of Battery Modules | 14: Sensor |
| 16: Switching Unit | 20: Higher-Level Controller |

-continued

[Description of Reference Numerals]

| | |
|---|---|
| 30: Battery Management Apparatus | 32: MCU |
| 34: Memory | 36: Input/Output I/F |
| 38: Communication I/F | 100: Battery Management Apparatus (BMS) |
| 110: Measuring Unit | 120: Calculating Unit |
| 130: Diagnosing Unit | 140: Storing Unit |

The invention claimed is:

1. A battery management apparatus comprising:

a measuring unit of a microcontroller linked to a sensor and configured to measure a voltage and a current of a battery cell via the sensor;

a calculating unit of the microcontroller configured to determine an operating period of the battery cell based on the current of the battery cell, and calculate a comparison value for the battery cell by normalizing the voltage of the battery cell; and a diagnosing unit of the microcontroller configured to diagnose a state of the battery cell by comparing the comparison value of the battery cell with a reference value, wherein the comparison value of the battery cell comprises first data that is a value obtained by normalizing an average voltage output value for a preset period for the battery cell, second data that is an amount of change of the first data, and third data that is a value obtained by normalizing the second data.

2. The battery management apparatus of claim 1, wherein the diagnosing unit is further configured to diagnose the state of the battery cell by comparing the first, second, and third data with first, second, and third reference values, respectively.

3. The battery management apparatus of claim 1, wherein the comparison value of the battery cell comprises fourth data that is a value obtained by normalizing an average voltage change output value for the preset period for the battery cell, fifth data that is an amount of change of the fourth data, and sixth data that is a value obtained by normalizing the fifth data.

4. The battery management apparatus of claim 3, wherein the diagnosing unit is further configured to diagnose the state of the battery cell by comparing the fourth, fifth, and sixth data with fourth, fifth, and sixth reference values, respectively.

5. The battery management apparatus of claim 1, wherein the state of the battery cell comprises one of (i) a voltage rise or a drop in one of charging, discharging, and idle periods of the battery cell, and (ii) long relaxation.

6. The battery management apparatus of claim 1, wherein the calculating unit is further configured to calculate the comparison value when a size of a period for performing normalization on the voltage of the battery cell is less than a reference value.

7. The battery management apparatus of claim 6, wherein the calculating unit is further configured to change the size of the period to recalculate the comparison value when the size of the period for performing normalization on the voltage of the battery cell is greater than or equal to the reference value.

8. The battery management apparatus of claim 1, wherein the calculating unit is further configured to determine whether the operating period of the battery cell is included in any one of a charging period, a discharging period, or an idle period, based on the current of the battery cell.

9. The battery management apparatus of claim 1, wherein the battery cell comprises a battery cell previously diagnosed as abnormal through a principal component analysis (PCA).

10. The battery management apparatus of claim 1, wherein an abnormal type of the battery cell comprises one of a lithium precipitation, an internal short-circuit, and a battery tab break.

11. The battery management apparatus of claim 10, wherein the diagnosing unit is further configured to classify the abnormal type of the battery cell as one including the lithium precipitation when a voltage behavior of the battery cell is at least one of a charging voltage drop, an idle voltage drop after charging, a discharging voltage rise, or an idle voltage rise after discharging.

12. The battery management apparatus of claim 10, wherein the diagnosing unit is further configured to classify the abnormal type of the battery cell as one including the internal short-circuit when the voltage behavior of the battery cell is at least one of a charging and discharging voltage drop or an idle voltage drop after charging and discharging.

13. The battery management apparatus of claim 10, wherein the diagnosing unit is further configured to classify the abnormal type of the battery cell as one including the battery tab break when the voltage behavior of the battery cell is at least one of a discharging voltage drop or a charging and discharging voltage rise.

14. A battery management method comprising:

measuring a voltage and a current of a battery cell;

determining an operating period of the battery cell based on the current of the battery cell;

calculating a comparison value for the battery cell by normalizing the voltage of the battery cell; and diagnosing a state of the battery cell by comparing a comparison value of the battery cell with a reference value, wherein the comparison value of the battery cell comprises first data that is a value obtained by normalizing an average voltage output value for a preset period for the battery cell, second data that is an amount of change of the first data, and third data that is a value obtained by normalizing the second data.

15. The battery management method of claim 14, wherein the diagnosing of the state of the battery cell comprises comparing the first, second, and third data with first, second, and third reference values, respectively.

16. The battery management method of claim 14, wherein the comparison value of the battery cell comprises fourth data that is a value obtained by normalizing an average voltage change output value for the preset period for the battery cell, fifth data that is an amount of change of the fourth data, and sixth data that is a value obtained by normalizing the fifth data.

17. The battery management method of claim 16, wherein the diagnosing of the state of the battery cell comprises comparing the fourth, fifth, and sixth data with fourth, fifth, and sixth reference values, respectively.

18. A battery management apparatus comprising:

a measuring unit of a microcontroller linked to a sensor and configured to measure a voltage and a current of a battery cell via the sensor;

a calculating unit of the microcontroller configured to determine an operating period of the battery cell based on the current of the battery cell, and calculate a comparison value for the battery cell by normalizing the voltage of the battery cell; and a diagnosing unit of the microcontroller configured to diagnose a state of the battery cell by comparing the comparison value of the battery cell with a reference value, wherein the calculating unit is further configured to calculate the comparison value when a size of a period for performing normalization on the voltage of the battery cell is less than a reference value.

* * * * *